(12) United States Patent
Kuypers et al.

(10) Patent No.: US 8,896,188 B2
(45) Date of Patent: Nov. 25, 2014

(54) RESONATOR ELECTRODES AND RELATED METHODS AND APPARATUS

(71) Applicant: Sand 9, Inc., Cambridge, MA (US)

(72) Inventors: Jan H. Kuypers, Cambridge, MA (US); Florian Thalmayr, Unterhaching (DE); Alexei Gaidarzhy, Brighton, MA (US); Guiti Zolfagharkhani, Brighton, MA (US)

(73) Assignee: Sand 9, Inc., Cambridge, MA (US)

( * ) Notice: Subject to any disclaimer, the term of this patent is extended or adjusted under 35 U.S.C. 154(b) by 0 days.

(21) Appl. No.: 13/860,312

(22) Filed: Apr. 10, 2013

(65) Prior Publication Data

US 2013/0334929 A1 Dec. 19, 2013

Related U.S. Application Data

(60) Provisional application No. 61/622,826, filed on Apr. 11, 2012.

(51) Int. Cl.
| | |
|---|---|
| *H03H 9/25* | (2006.01) |
| *H01L 41/047* | (2006.01) |
| *G03F 7/20* | (2006.01) |
| *H01L 41/09* | (2006.01) |
| *H03H 9/13* | (2006.01) |
| *H03H 3/02* | (2006.01) |

(52) U.S. Cl.
CPC ............ *H01L 41/09* (2013.01); *G03F 7/70216* (2013.01); *H03H 2003/027* (2013.01); *H03H 9/132* (2013.01)
USPC ................. 310/365; 310/313 R; 310/313 B

(58) Field of Classification Search
USPC .......... 310/348–353, 363, 365, 313 R, 313 B
See application file for complete search history.

(56) References Cited

U.S. PATENT DOCUMENTS

| | | | |
|---|---|---|---|
| 7,745,979 B2* | 6/2010 | Tsuchido | 310/365 |
| 8,058,769 B2 | 11/2011 | Chen et al. | |
| 2007/0178746 A1* | 8/2007 | Guo et al. | 439/406 |
| 2008/0079516 A1* | 4/2008 | Ruby et al. | 333/189 |
| 2009/0105553 A1* | 4/2009 | Wu et al. | 600/300 |
| 2009/0243747 A1 | 10/2009 | Gaidarzhy et al. | |
| 2010/0026136 A1 | 2/2010 | Gaidarzhy et al. | |
| 2012/0322164 A1* | 12/2012 | Lal et al. | 436/501 |
| 2013/0015744 A1* | 1/2013 | Adkisson et al. | 310/313 C |

FOREIGN PATENT DOCUMENTS

WO  WO 2006-083482 A2  8/2006

\* cited by examiner

*Primary Examiner* — Thomas Dougherty
(74) *Attorney, Agent, or Firm* — Wolf, Greenfield & Sacks, P.C.

(57) ABSTRACT

Resonator structures and electrodes are described, as well as methods for manufacturing the same. Resonator electrodes may be formed using two or more photolithographic steps and masks, with different masks being used to define different features of the electrodes. The masks may create self-aligned electrodes, which can be aligned with one or more anchors of the resonator.

11 Claims, 19 Drawing Sheets

RESONATOR ELECTRODES AND RELATED METHODS AND APPARATUS

CROSS-REFERENCE TO RELATED APPLICATIONS

This application claims the benefit under 35 U.S.C. §119(e) of U.S. Provisional Application Ser. No. 61/622,826, entitled "RESONATOR ELECTRODES AND RELATED METHODS AND APPARATUS" filed on Apr. 11, 2012, which is hereby incorporated herein by reference in its entirety.

BACKGROUND

1. Field

The present disclosure relates to resonator structures and electrodes, and to methods and apparatus for manufacturing the same.

2. Related Art

Mechanical resonators are physical structures that are designed to vibrate. Such resonators may be incorporated into a variety of devices such as timing oscillators, mass sensors, gyros, accelerometers, switches, and electromagnetic fuel sensors, amongst others.

Primary properties of mechanical resonating structures include the resonance frequency $f_0$, the resonance quality factor Q, the motional resistance $R_m$, and the temperature characteristics and the frequency of undesired spurious vibrations.

The design parameters impacting the primary properties of the mechanical resonating structure may include but are not limited to defining the geometry of the resonating structure including width length, thickness and curvature of the resonant body, selection of material to employ materials of certain properties, selection of the ratio and the thicknesses of the employed materials, patterning certain layers of the mechanical resonating structure, and defining the connection of the resonating body to a substrate by design of anchors and anchor points.

Mechanical resonating structures are sometimes formed using wafer-level processing in which multiple mechanical resonating structures are formed on a single wafer. Wafer-level mass-production processes may produce a wafer with a plurality of mechanical resonating structures, where each of the design parameters may be met by only a few devices, while the majority of the mechanical resonating structures may have design parameters slightly different from the desired design parameters.

SUMMARY

According to an aspect of the present application, a method is provided, comprising forming an electrode of a microfabricated mechanical resonating structure. The electrode is formed by using a first photolithographic mask to define a first subset of features of the electrode and using a second photolithographic mask to define a second subset of features of the electrode.

According to an aspect of the present application, a mechanical resonating structure is provided, comprising an active layer, and a self-aligned electrode layer.

According to an aspect of the present application, a mechanical resonating structure is provided, comprising a plate configured to resonate and having an active layer. The mechanical resonating structure further comprises an anchor coupling the plate to a substrate, and a conductive layer on an upper surface of the active layer, the conductive layer having an outer boundary coincident with an outer boundary of the plate.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
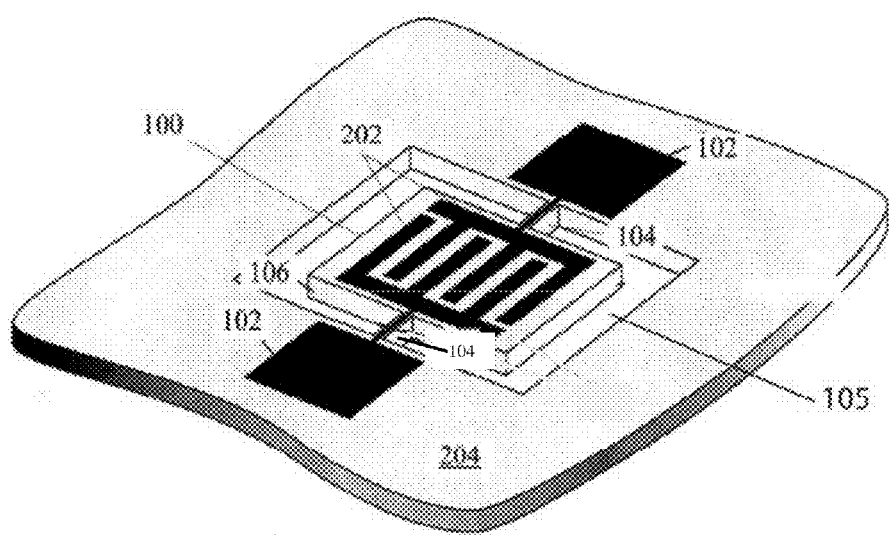
FIG. 1 illustrates a perspective view of a mechanical resonating structure, according to a non-limiting embodiment.

Applicants have appreciated that it may be beneficial when microfabricating electrodes of a resonator or other device to delay final definition of the electrode(s) until as late a stage during the fabrication process as possible. Microfabrication of resonators, as an example, involves many processing steps. Implementing process sequences for which any electrode(s) of the resonator (or other device) is not finally defined until the later stages of processing may provide flexibility during the fabrication process in selecting the final design of the electrode(s), which may also lead to faster fabrication cycles, thus reducing time and cost in fabricating resonators (or other devices) having such electrodes.

Also, Applicants have appreciated that it may be advantageous for mechanical resonating structures being microfabricated on a wafer to be designed so that the process-induced variation of design parameters results in a minimum variation in primary properties of the mechanical resonating structure across the wafer.

According to aspects of the present application, variation in resonator primary properties across a wafer and flexibility in resonator definition may be achieved using an electrode fabrication sequence involving multiple photolithography masks and multiple photolithography definition steps. According to one such aspect of the application, techniques are described for forming self-aligned electrodes, such as self-aligned electrodes of a resonator (e.g., a microelectromechanical systems (MEMS) resonator). According to one embodiment, a method is implemented comprising forming certain, but not all, electrode features during a first stage of processing, which first stage may involve the use of a first photolithography mask. Additional features of the electrodes may be formed during a later stage of processing, for example using a different photolithography mask. According to an embodiment, features such as electrode spacing and outer limit may be defined during the first stage of processing, for example using a first mask. Features such as electrode shape, electrode number, and electrical connection thereto may be defined at the subsequent, second stage of processing, for example using a different mask than that used during the first stage.

According to an embodiment of the present application, a blanket conductive layer may be deposited on a mechanical resonating structure. The blanket conductive layer may serve as the basis for subsequent electrode formation. However, initially, the blanket conductive layer may substantially cover the mechanical resonating structure, without taking the final form of the electrodes. Initially, a limited number of features of the ultimate electrode design may be formed in the blanket conductive layer, including the electrode spacing. Such features may be defined using a first mask process. The blanket conductive layer with limited features may be considered a "blank", still subject to further definition to finalize the electrodes. Final definition of the electrodes may be performed subsequently, for example using a later mask process.

According to one embodiment, it may be desirable to have a short lead time in the manufacture of a MEMS product, such as a MEMS resonator. Use of one or more aspects as described herein may allow for a short lead time, for example by allowing for a majority of the product to be manufactured at an initial stage while leaving flexibility in the final design of the product until a later stage. In this manner, according to an embodiment, once a final design is decided upon, manufacturing of the final product may only involve performing a small number of final steps since the majority of the product has already been fabricated.

The aspects and embodiments described above, as well as additional aspects and embodiments, are described further below. These aspects and embodiments may be used individually, all together, or in any combination of two or more, as the technology is not limited in this respect.

Aspects of the present application apply to various types of devices, including various types of resonating structures. As a non-limiting example, aspects of the present application may apply to various types of MEMS resonators having one or more electrodes. For purposes of illustration, FIG. 1 shows a non-limiting example of a resonating structure to which one or more aspects of the present application may apply. However, it should be appreciated that FIG. 1 illustrates a non-limiting example, and that the aspects described herein are not limited to the type of mechanical resonating structure shown in FIG. 1.

FIG. 1 shows a mechanical resonating structure 100 according to an embodiment of the present application. The mechanical resonating structure 100 includes a resonating structure plate 106 and is connected to (electrical) pads 102 via anchors 104 according to this embodiment. Trenches 105 separate the resonating structure plate 106 from surrounding structures. The resonating structure plate 106 may include an active layer (or actuation layer) 204. Interdigital electrodes 202 may be formed on the active layer 204 in some embodiments.

As described further below, the mechanical resonating structure 100 vibrates in response to a source of excitation (e.g., application of an electrical potential), and in some embodiments is configured (shaped, sized, etc.) to support one or more modes of Lamb waves. The mechanical vibration of the mechanical resonating structure 100 may be converted to an electrical output signal which, for example, may be further processed. The mechanical resonating structure can generate signals with multiple modes and resonant frequencies, and, as mentioned, in some embodiments may be configured to support one or more modes of Lamb waves, although not all embodiments are limited in this respect. Typically, one of the modes can dominate and the mechanical resonating structure can vibrate at the resonant frequency associated with the dominant mode. As previously described, the mechanical resonating structure 100 can include a resonating structure plate 106 and interdigital transducer (IDT) electrodes 202.

The frequency produced by the mechanical resonating structure may vary depending on the design and application. For example, the frequency produced may be between 1 kHz and 10 GHz. In some embodiments, for example, the frequencies are in the upper MHz range (e.g., greater than 100 MHz), or at least 1 GHz (e.g., between 1 GHz and 10 GHz). In some cases, the signal may have a frequency of at least 1 MHz (e.g., 13 MHz, 26 MHz) or, in some cases, at least 32 kHz.

The dimensions of the mechanical resonating structure 100, and more generally the mechanical resonating structures described herein, depend, in part, on the desired performance including the desired frequency behavior. According to some embodiments, the mechanical resonating structure can be a micromechanical resonator. The mechanical resonating structure may have a "large dimension" (i.e., the largest of the length, width, thickness, etc.) of less than 1 mm; in some cases, the large dimension is less than 500 micron, or less than 100 micron, or less than 10 micron.

The mechanical resonating structures described herein may have any suitable shape. For example, the configuration of the mechanical resonating structure can include, for example, any antenna type geometry, as well as beams, cantilevers, free-free bridges, free-clamped bridges, clamped-clamped bridges, discs, rings, prisms, cylinders, tubes, spheres, shells, springs, polygons, diaphragms and tori. Any of the mechanical resonating structure elements may be formed either in whole or in part of the same or different geometries. In addition, several different type geometrical structures may be coupled together to obtain particular resonance mode responses.

The anchors 104 can be placed at locations of minimum displacement (of the mechanical resonating structure), so that spurious resonator modes can be suppressed. Similarly, geometrical and structural alterations can be made to improve quality (e.g., Q-factor, noise) of the signal generated by the mechanical resonating structure 100.

In some embodiments, the mechanical resonating structure may include a plurality of resonating elements. At least some of the resonating elements may be coupled to one another. In some of these embodiments, the resonating elements may have different dimensions. For example, the mechanical resonating structure may include at least one major element that has a large dimension that is larger than the large dimension of a minor element of the mechanical resonating structure. In general, the minor elements have at least one smaller dimension (e.g., length, thickness, width) than the major element. Minor elements can have a shorter length than the major element. The minor elements may have nanoscale (i.e., less than 1 micron) dimensions. In some embodiments, at least one of the dimensions is less than 1 micron; and, in some embodiments, the large dimension (i.e., the largest of the dimensions) is less than 1 micron. In one embodiment, the smallest dimension of the mechanical resonating structure may be on the order of 5 micron (e.g., 10 micron, 5 micron, 1 micron, etc.). Other dimensions are also possible.

It should be appreciated that while two anchors 104 are shown in FIG. 1, any number of anchors may be used in those embodiments employing anchors, and that the technology described herein is not limited to use with any number of anchors. Thus, according to some embodiments, one or more anchors may be included and may be positioned in any of the manners described above, or in any other suitable locations.

Suitable mechanical resonating structures have been described, for example, in International Patent Publication No. WO 2006/083482, U.S. patent application Ser. No. 12/181,531, filed Jul. 29, 2008 and published Feb. 4, 2010 as U.S. Patent Application Publication 2010-0026136-A1, in U.S. patent application Ser. No. 12/142,254, filed Jun. 19, 2008 and published Oct. 1, 2009 as U.S. Patent Application Publication 2009-0243747, and in U.S. patent application Ser. No. 12/639,161, issued as U.S. Pat. No. 8,058,769, all of which are incorporated herein by reference in their entireties. It should be understood that a number of different designs for the mechanical resonating structure are also suitable.

It should be appreciated that configuration of IDT electrodes 202 and resonating structure plate 106 shown in FIG. 1 represents a non-limiting example. For example, the number and configuration of the IDT electrodes 202 is non-limiting, an alternatives are possible. Moreover, aspects of the present application apply to electrode configurations that may not be considered IDT electrodes, such as single electrodes.

According to some embodiments, a mechanical resonating structure such as mechanical resonating structure 100 may comprise or be formed of multiple layers, making the structure a composite structure. For example, the mechanical resonating structure may comprise a base (e.g., resonating structure plate 106) on which electrodes are formed (e.g., IDT electrodes 202). In addition, the base (e.g., resonating structure plate 106) may itself comprise one or more layers of differing materials, shapes, and/or thicknesses.

As a non-limiting example, the resonating structure plate 106 may include an active layer (e.g., a piezoelectric active layer actuated using piezoelectric techniques) and a compensating (or compensation) structure coupled to the active layer. The compensating structure may be configured to compensate temperature induced variation in the resonance frequency of the mechanical resonating structure, for example by compensating temperature-induced variations in stiffness of at least the active layer. As a non-limiting example, the compensating structure can have multiple layers, including having a first layer having a stiffness that increases with increasing temperature over at least a first temperature range, a third layer having a stiffness that increases with increasing temperature over at least the first temperature range and a second layer between the first layer and the third layer. The second layer may have a stiffness that decreases with increasing temperature over at least the first temperature range. In some embodiments, the first and third layers may be formed of the same material as each other and the second layer may be formed of a different material. Non-limiting examples of such mechanical resonating structures, to which aspects of the present application may be applied, are described in U.S. Pat. No. 8,058,769, referenced above and incorporated herein by reference in its entirety. Thus, as an example, the mechanical resonating structure of FIG. 1 may be of the types described in U.S. Pat. No. 8,058,769.

In one embodiment, a method is provided for constructing a mechanical resonating structure by forming an active layer on a surface of a compensating structure, for example to form the types of mechanical resonating structures described above in which the compensating structure has multiple layers having an adaptive stiffness that reduces a variance in a resonating frequency of the mechanical resonating structure as a function of temperature. The method can further include adjusting an operational profile of the mechanical resonating structure by adding one or more materials to at least a first portion of the mechanical resonating structure, removing one or more materials from at least a second portion of the mechanical resonating structure, or combinations thereof.

Figure 2:
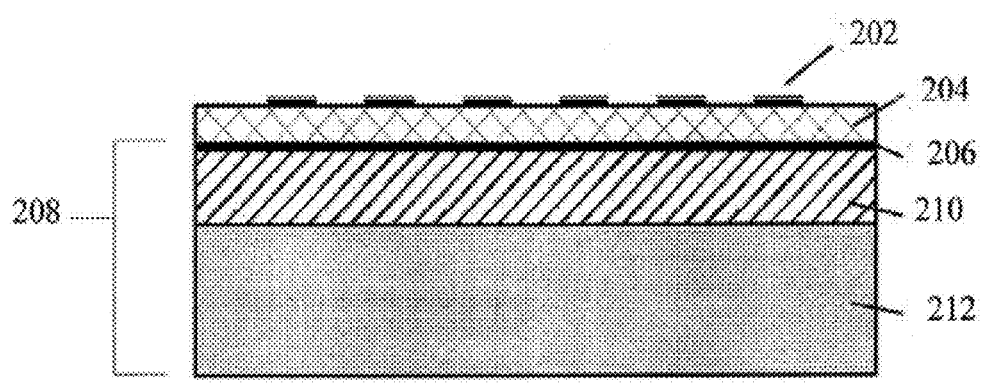
FIG. 2 illustrates a cross-sectional view of a mechanical resonating structure of the type of FIG. 1, according to a non-limiting embodiment.

FIG. 2 illustrates a cross-sectional view of a mechanical resonating structure according to some embodiments, and which may be used as the mechanical resonating structure of FIG. 1. As shown, the mechanical resonating structure can be built using several components, layers, and materials including IDT electrodes 202, active layer 204, electrode layer(s) 206 (e.g., serving as a bottom electrode, ground electrode, or other suitable electrode) and a compensating structure 208 including a first layer 210 (e.g., formed of silicon oxide or other suitable material) and a second layer 212 (e.g., formed of silicon or other suitable material).

The active layer 204 responds to the transduction method used to actuate the mechanical resonating structure (i.e., cause to vibrate) and/or detect motion of the mechanical resonating structure. It should be understood that any transduction method may be used including piezoelectric, piezoresistive, electrostatic, electrostrictive, electromotive, magnetostrictive, magnetomotive, thermal, spin-torque effect, and spin-polarized current driven magnetic excitation, amongst others.

The active layer 204 may have any suitable construction (including composition) which may depend, in part, on the transduction method used for actuation and/or detection. In some embodiments, the active layer 204 is formed of a piezoelectric material. In some embodiments, the active layer 204 is formed of a semiconductor material such as silicon. It should be understood that other compositions are also possible. In some cases, the active layer 204 is formed of multiple layers. For example, the active layer 204 may comprise multiple layers, one or more of which are functional (e.g., piezoelectric) and one or more of which are not.

As noted above, the active layer may be formed of a piezoelectric material. Examples of suitable materials include aluminum nitride (AlN), zinc oxide (ZnO), cadmium sulfide (CdS), quartz, lead titanate (PbTiO$_3$), lead zirconate titanate (PZT), lithium niobate (LiNbO$_3$), and lithium tantalate (LiTaO$_3$). In some embodiments, AlN may be preferred.

In the illustrated embodiment of FIG. 2, active layer 204 is formed on compensation structure 208. Other configurations are also possible. For example, in some cases, the compensation structure 208 may be formed on the active layer.

As shown in FIG. 2, compensation structure 208 includes multiple components (e.g., layers 210 and 212). In general, characteristics (e.g., composition, dimensions, and arrangement within the structure) of the components (e.g., layers) are selected such that structure 208 provides the desired compensation with respect to the active layer and any additional layers to be compensated, so that the mechanical resonating structure exhibits a desired behavior across a range of temperatures for any modes of vibration of interest.

It should be understood that, in certain embodiments, the compensating structure may include one or more layers in addition to those shown in FIG. 2. The additional layer(s) may have the same composition as one of the layers 210 or 212. In other embodiments, the additional layer(s) may have a different compensation than both the layer 210 and the layer 212.

According to some embodiments, the mechanical resonating structure has an overall thickness T which, in some embodiments, is less than approximately one wavelength of the resonance frequency of interest of the mechanical resonating structure (e.g., less than approximately one wavelength of a resonant Lamb wave supported by the mechanical resonating structure). In some embodiments, the thickness T is less than approximately ½ wavelength of the resonance frequency of interest. In other embodiments, the thickness T is approximately equal to or less than approximately ⅙ wavelength of the resonance frequency of interest. Other thickness values are also possible. According to some embodiments, the thickness of the mechanical resonating structure is between approximately 2-100 times smaller than the length and width of the mechanical resonating structure (e.g., 5 times smaller, 10 times smaller, 50 times smaller, etc.), such that any vibration in the direction of the thickness may be negligible compared to vibration approximately parallel to the length and width. According to some embodiments, the mechanical resonating structures described herein have a large dimension (e.g., length, width, diameter, circumference, etc.) of less than approximately 1,000 microns, less than 100 microns, less than 50 microns, any value within such ranges, or any other suitable value. It should be appreciated that other sizes are also possible. According to some embodiments, the devices described herein form part or all of a microelectromechanical system (MEMS).

The mechanical resonating structure may be manufactured on a wafer, where a plurality of mechanical resonating structures such as those described herein are on a single wafer. Because of the possible small dimensions of a mechanical resonating structure, a single wafer can include hundreds (or thousands) of single dies each carrying a mechanical resonating structure, such as a two-port or four-port mechanical resonating structure such as shown in FIG. 1.

In addition to the features shown in FIG. 1, a single die may also contain peripheral elements suitable or necessary for the specific application of the resonating structure. Non-limiting examples for peripheral elements are stress relief structures such as trenches and bending beams, cavities, electrical routings, through-hole vias, bonding pads (for electrical connection to a bonded wafer), seal rings (for hermetic sealing after wafer bonding), resistors, temperature sensors and heating elements.

Wafer-level production processes for forming mechanical resonating structures may comprise or consist of, for example, several dozens of sub-steps. Fabrication processes may include but are not limited to thermal oxidization, wet-etching, dry-etching, plasma vapor deposition (PVD) (sputter deposition, thermal evaporation, electron-beam evaporation), chemical vapor deposition (CVD) and chemical mechanical polishing (CMP).

Sub-steps of the process may be applied only on well-defined portions of the wafer/die to define the lateral dimensions of the mechanical resonating structure, the anchoring to the substrate, and/or to create a certain topology, routing, and other peripheral elements as described above. This spatial definition may be performed by using a lithographic mask process, where a photosensitive resist is deposited on the wafer, lithographically patterned by usage of a positive or negative mask and selectively etched.

Generally, mechanical resonating structures may need different primary properties depending on the intended application of the resonating structure. For example, for an application in an oscillator with very good phase noise performance, but less stringent tuning demands, it may be desirable to have a mechanical resonator with a high Q factor. On the other hand, for an application in an oscillator with large tuning range, but less stringent or lower phase noise performance it may be desirable to have a small to medium Q factor.

Thus, it may be desired to have different mechanical resonating structures with different primary properties for different applications on the same wafer. Further, it may be desired to have different mechanical resonating structures with different primary properties either for evaluation purposes or for different primary applications on the same wafer. Yet, for processing a single wafer-lot, it may be advantageous in terms of costs to only have a single mask set in usage. Therefore it may be advantageous to have mechanical resonating structures for different applications on a single lithographic mask and wafer.

Also, it should be appreciated that the lead-time from the first wafer processing step to the final wafer processing step is usually on the order of weeks or months. This long time results from the fact that the resonator and peripheral manufacturing process often involves tens or even hundreds of single process steps, some of which are performed at different specialized manufacturers. Thus, not only do the processing steps themselves require time, but transport between different manufacturing facilities requires time.

Applicants have appreciated that it may be advantageous to provide shorter lead times in the development of mechanical resonating structures, such as shorter times from deciding the primary application properties and the derivable mechanical resonator design properties to the final wafer-lot processing step, in comparison to the overall wafer processing lead-time. Reducing such lead times may enable quick adaption of the mechanical resonating structures being manufactured to changing market demands for different products, to changes in global process and to design changes, as non-limiting examples.

Figure 3A:
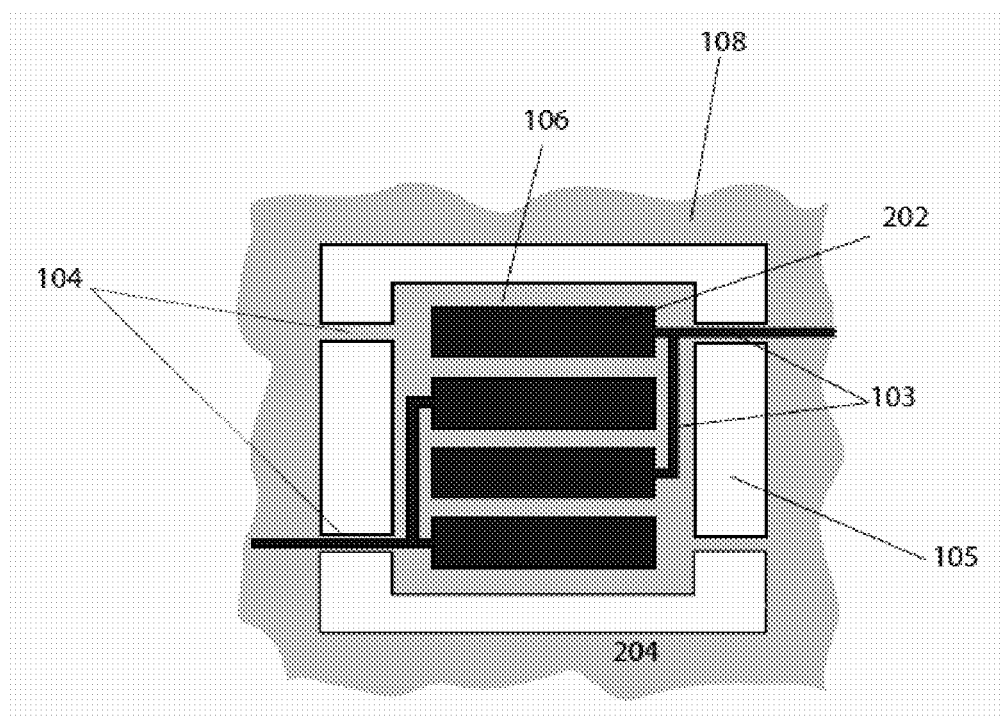
FIG. 3A illustrates a top view of a mechanical resonating structure including interdigital transducer (IDT) electrodes, according to a non-limiting embodiment.

FIG. 3A illustrates the top-view of a mechanical resonating structure including the resonating structure plate 106, a substrate 108, the IDT electrodes 202, the anchors 104 and electrical routing 103. From the top, only the actuation layer 204 and the electrical conductor layer including routing 103 and IDT electrodes 202 are visible. The trenches 105 separating resonating structure plate 106 from the substrate 108 are also shown.

It should be appreciated in FIG. 3A that the resonating structure plate 106 may include layers below the active layer 204, such as those layers described previously in connection with FIG. 2, and that all such layers beneath the active layer 204 may be patterned together with the active layer 204. The layers below the electrical conductor layer (which, again, is formed by the combination of routing 103 and IDT electrodes 202) will be referred to herein for simplicity as the device layer(s).

Figure 3B:
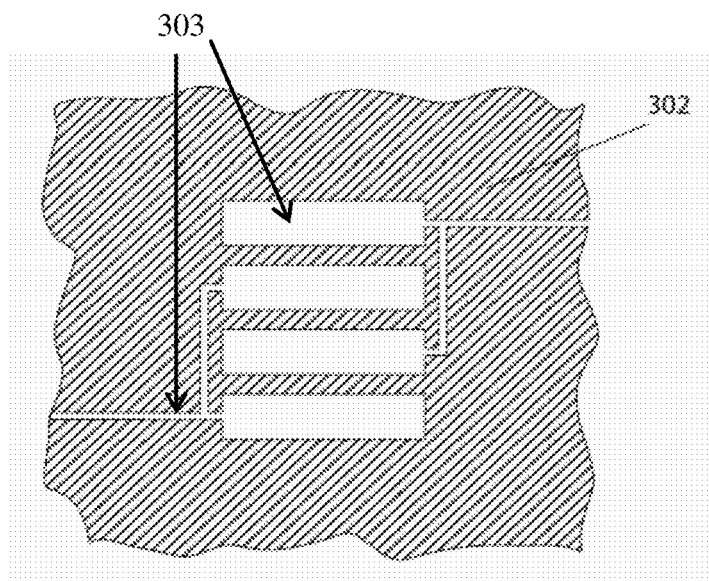
FIGS. 3B and 3C illustrate positive and negative masks, respectively, which may be used to fabricate the structure of FIG. 3A.

FIG. 3B illustrates an example of a positive (photolithography) mask 302, which is used for photolithographic definition of the electrical conductor layer in FIG. 3A. As shown, the mask 302 includes openings 303 corresponding to the IDT electrodes 202 and the routing 103 of FIG. 3A. A negative mask would look complementary to that illustrated in FIG. 3B. In this example, the conductor configuration in terms of width, periodicity and metallization ratio is defined in this mask. In addition, the electrical routing on the resonating structure plate, the suspension anchors and the periphery are also defined.

Figure 3C:
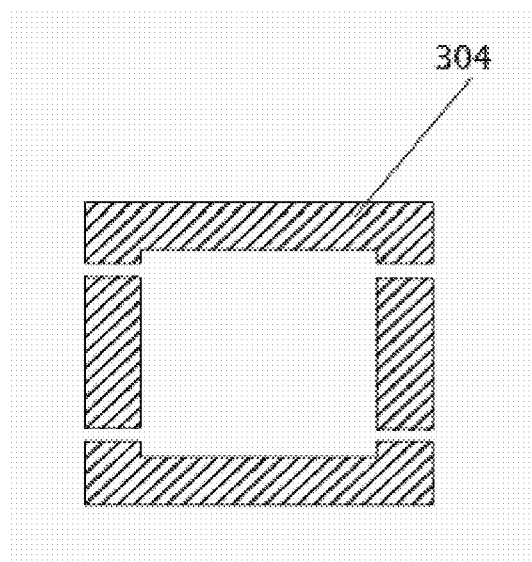

FIG. 3C illustrates an example of a negative (photolithography) mask 304 which may be used for photolithographic definition of the lateral dimensions of the resonating structure plate 106, the anchors 104 and the separation trenches 105 of FIG. 3A. A positive mask would look complementary to that illustrated in FIG. 3A.

Figure 4:
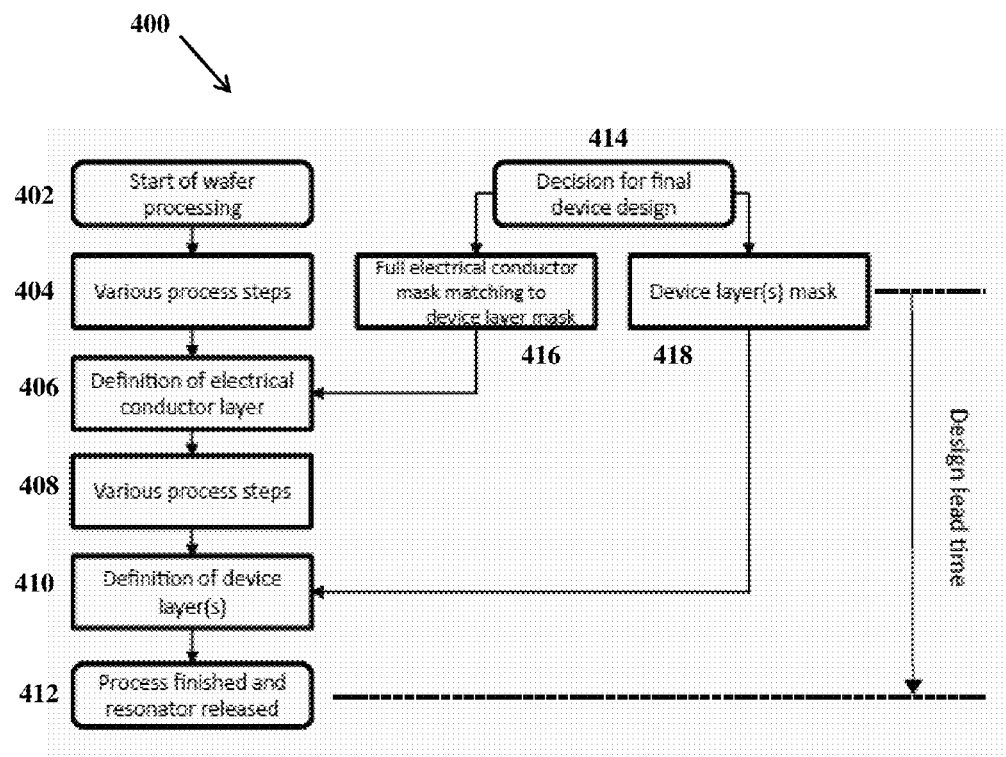
FIG. 4 illustrates an example of a process which may be used to form resonator electrodes, according to a non-limiting embodiment.

FIG. 4 illustrates the process and design flow 400 used to design and form the IDT electrodes 202 and routing 103 of FIG. 3A. After starting the processing of the wafer at stage 402, there may be various process steps represented by a single stage 404 for purposes of simplicity, before the electrical conductor layer is defined photolithographically at stage 406. Before the photolithographic definition of the conductor layer at stage 406, the decision of the device design in terms of mask for the electrical conductor patterning and the device layer(s) is necessary. For example, the final device design may be decided upon at stage 414, after which masks for the electrical conductor may be finalized at stage 416 and masks for the device layer(s) may be finalized at stage 418.

The conductor layer may be photolithographically defined at stage 406 using the masks finalized at stage 416. Subsequently, various processing steps may be applied (e.g., passivation, oxidation, polishing, etc.), which are represented for purposes of simplicity as a single stage 408. Subsequently, at stage 410 the device layer(s) may be defined using the masks finalized at stage 418. At stage 412, the fabrication of the resonator may be finished and the resonator released.

By contrast to the manufacturing process described in connection with FIGS. 3A-3C and FIG. 4, aspects of the present application provide for the design and formation of self-aligned electrodes. According to some embodiments, only the spacing and the period of the single electrodes are defined in the process step for patterning of the electrical conducting layer structure, while the electrical routing on the plate and the anchor structures are not defined in terms of having a specific routing structure on the anchors and the plate.

According to some embodiments, the conductor configuration formed on the mechanical resonating structure is self-aligning with the dimensions of the plate of the mechanical resonating structure. Electrical routing on the anchors and on the plate is obtained by patterning the lateral dimensions of the mechanical resonating structure, the anchors, stress relief trenches and other die features on the membrane.

Figure 5A:
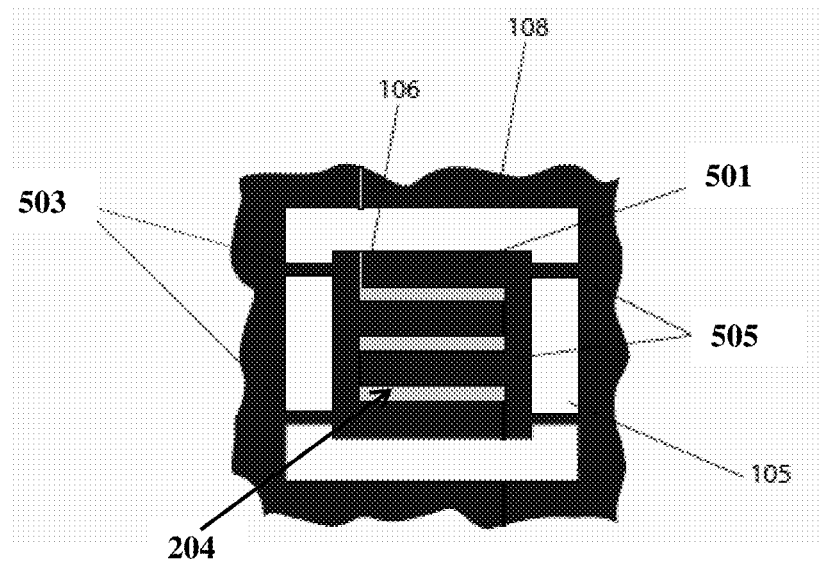
FIG. 5A illustrates atop view of a self-aligned mechanical resonating structure including interdigital transducer electrodes, according to a non-limiting embodiment.

FIG. 5A illustrates a top view of a self-aligned mechanical resonating structure including the resonating structure plate 106, IDT electrodes 501, anchors 503 and the electrical routing 505. From the top, only the active layer 204 and the electrical conductor layer formed by routing 505 and IDT electrodes 501 are visible, where here the electrical conductor layer reaches to the lateral dimensions of the resonating structure plate 106 and covers the whole anchor and peripheral area, including substrate 108. These extended areas form the self-aligned electrical routing. The trenches 105 separating resonating structure plate 106 and substrate 108 are also shown in the figure.

Figure 5B:
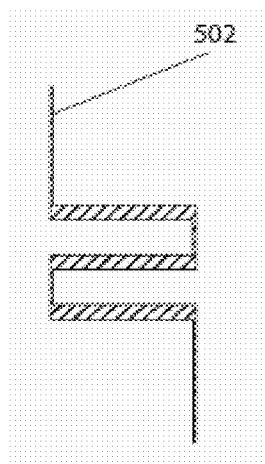
FIG. 5B illustrates an example of a positive mask which may be used for photolithographic definition of the electrical conductor layer in FIG. 5A.

FIG. 5B illustrates an example of a positive mask 502, which may be used for photolithographic definition of the electrical conductor layer in FIG. 5A. Here the conductor configuration in terms of width, periodicity and metallization ratio for the inner electrodes is defined in this mask. However, it should be appreciated that such definition represents a limited number of features of the electrodes compared to the mask of FIG. 3B used when defining the conductor layer of FIG. 3A. A negative mask would look complementary to the illustrated figure.

Figure 5C:
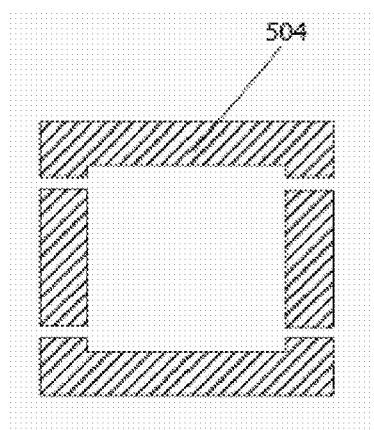
FIG. 5C illustrates an example of a negative mask which may be used for photolithographic definition of the lateral dimensions of the structure of FIG. 5A.

FIG. 5C illustrates an example of a negative mask 504 which may be used for photolithographic definition of the lateral dimensions of the resonating structure plate 106 in FIG. 5A, the anchors 503 and the trenches 105. This device mask also defines the routing 505 by self-aligned patterning of the electrical conductor layer. A positive mask would look complementary to the illustrated figure.

It should be appreciated that for the self-aligned electrode design of the mechanical resonating structure in FIG. 5A, the electrical routing on the anchors and the plate are now also defined with mask 504. It should be further appreciated that the positive mask 502 for the self-aligned electrical conductor looks substantially different than the mask 302 for the conventional design.

Figure 6A:
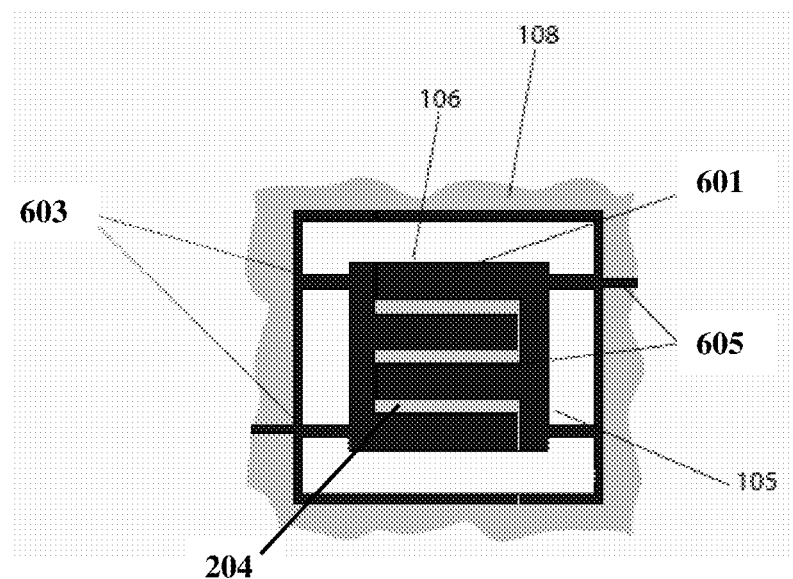
FIG. 6A illustrates a top-view of another non-limiting example of a self-aligned electrode design including interdigital transducer electrodes.

FIG. 6A illustrates a top view of another non-limiting example of a self-aligned electrode design including the resonating structure plate 106, IDT electrodes 601, anchors 603 and the electrical routing 605. In a non-limiting embodiment, the illustrated structure may represent a finished resonator product, though not all embodiments are limited in this respect. From the top, only the active layer 204 and the electrical conductor layer formed by IDT electrodes 601 and routing 605 are visible, where here the electrical conductor layer reaches to the lateral dimensions of the structure plate, covers the whole anchor and a small area around the trenches 105. The routing in the peripheral area is achieved by the patterning of the electrical conductor layer, but the routing on the resonating structure plate 106 and anchors 104 is achieved by the definition of the device.

Figure 6B:
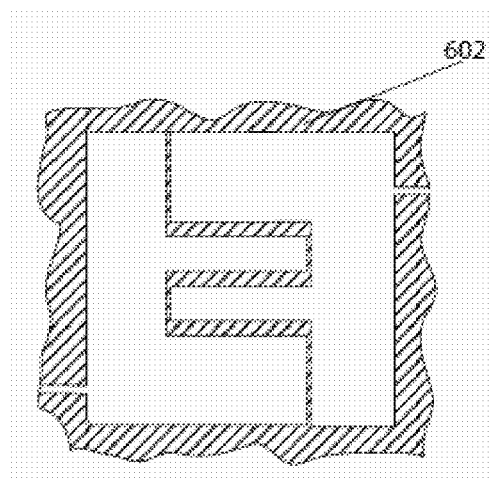
FIG. 6B illustrates an example of a positive mask which may be used for photolithographic definition of the electrical conductor layer in FIG. 6A.

FIG. 6B illustrates an example of a positive mask 602, which may be used for photolithographic definition of the electrical conductor layer in FIG. 6A. Here the conductor configuration in terms of width, periodicity, metallization ratio for the inner electrodes and the electrical routing in the peripheral region are defined in this mask. A negative mask would look complementary to the illustrated figure.

Figure 6C:
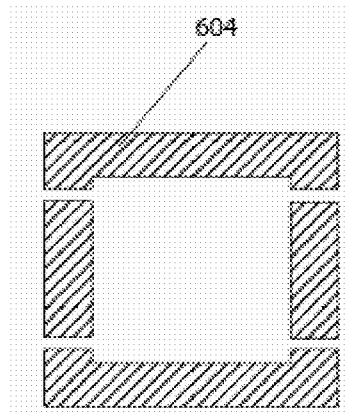
FIG. 6C illustrates an example of a negative mask which may be used for photolithographic definition of the lateral dimensions of the structure of FIG. 6A.

FIG. 6C illustrates an example of a negative mask 604 which may be used for photolithographic definition of the lateral dimensions of the resonating structure plate 106, the anchors 603 and the trenches 105 of FIG. 6A. This device mask also defines the routing by self-aligned patterning of the electrical conductor layer on the anchors and the structure plate. A positive mask would look complementary to the illustrated figure.

It should be appreciated that both self-aligned electrode designs illustrated in FIG. 5A and FIG. 6A have different advantages. It should be appreciated that the self-aligned electrode design depicted in FIG. 5A may allow more flexibility in terms of dimension of anchors 503 and trenches 105, while the self-aligned electrode design depicted in FIG. 6A may be advantageous in terms of primary properties of the mechanical resonating structures, where non-limiting examples are the quality factor of vibration and static capacitance.

It should be appreciated that a self-aligned electrode design technique may use any suitable combination of the two possible self-aligned electrode designs of FIG. 5A and FIG. 6A.

By the usage of the self-aligned electrode, the change of the design parameters can be achieved by adjustment of only a single mask used for the last or one of the last process steps of the whole wafer manufacturing process. Thus, flexibility in design may be provided, and lead time may be reduced.

Non-limiting examples for design adjustments (which may be substantial adjustments in some embodiments) possible with the self-aligned electrode depicted in FIG. 5A are illustrated in FIG. 7A to FIG. 7H as resonators 702, 704, 706, 708, 710, 712, 714, and 716, respectively.

Figure 7A:
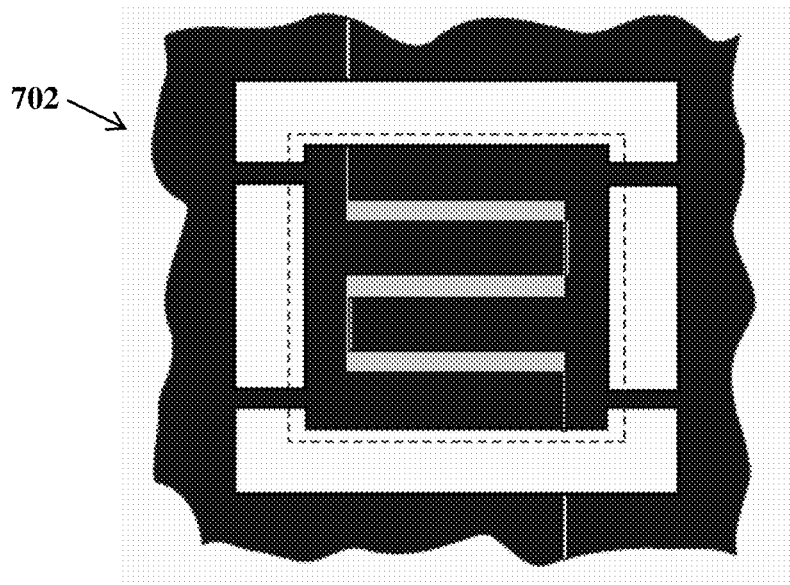
FIGS. 7A-7H illustrate top views of non-limiting examples of resonators according to embodiments of the present application.

FIG. 7A illustrates a resonator 202 and denotes the possibility to adjust the length and width of the resonating plate structure 106, which may be necessary to adjust the frequency of resonance or unwanted resonances in the mechanical resonating structure.

Figure 7B:
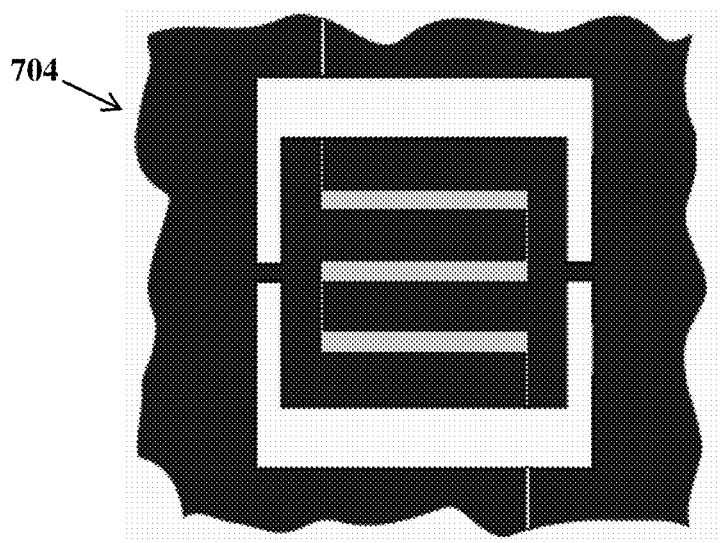
Figure 7C:
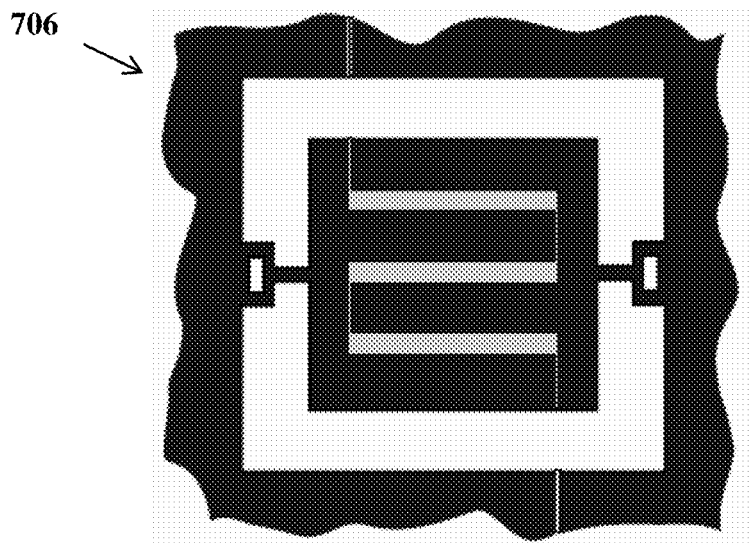
Figure 7D:
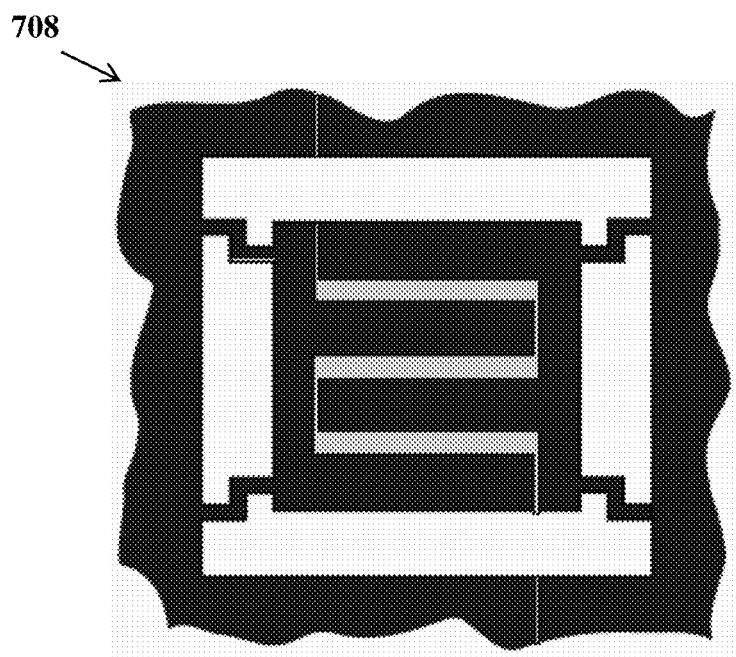
Figure 7E:
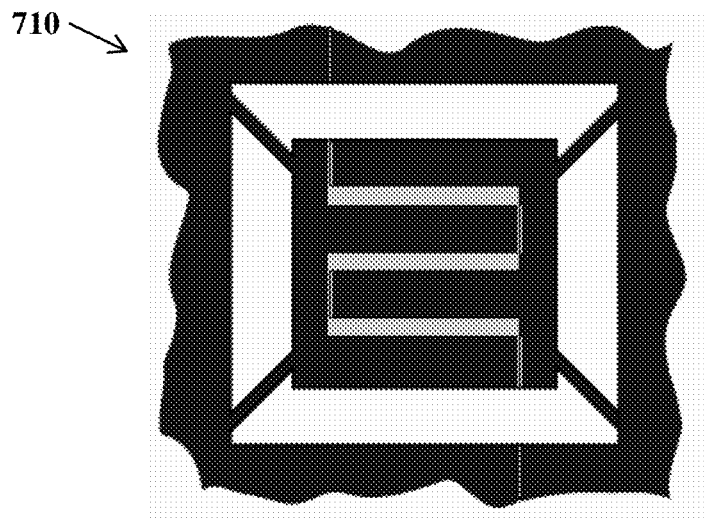
Figure 7F:
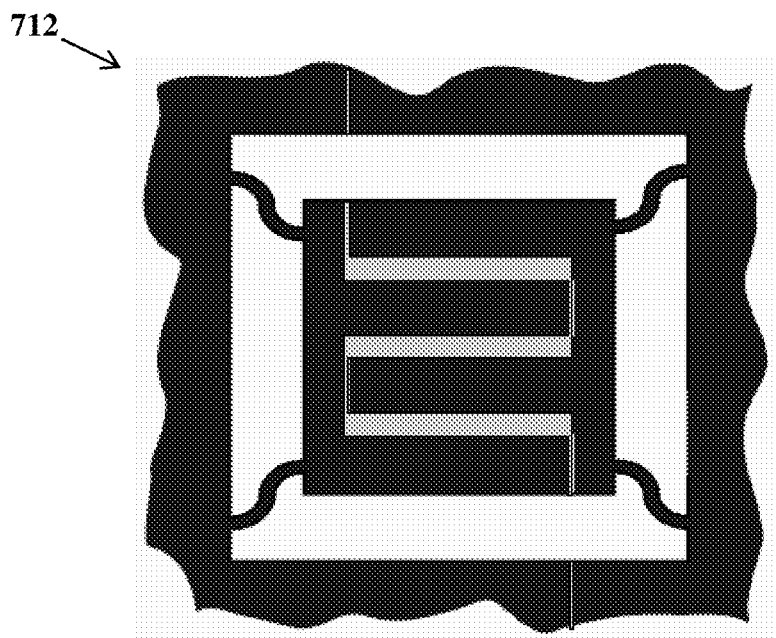
Figure 7G:
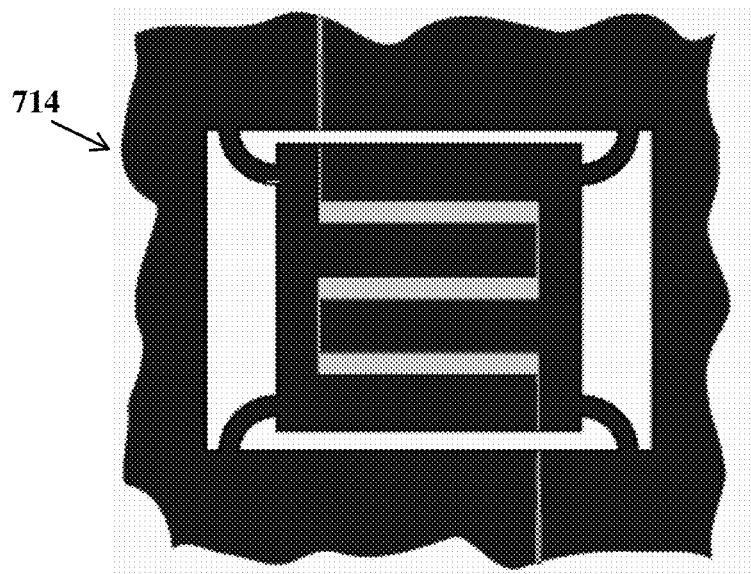
Figure 7H:
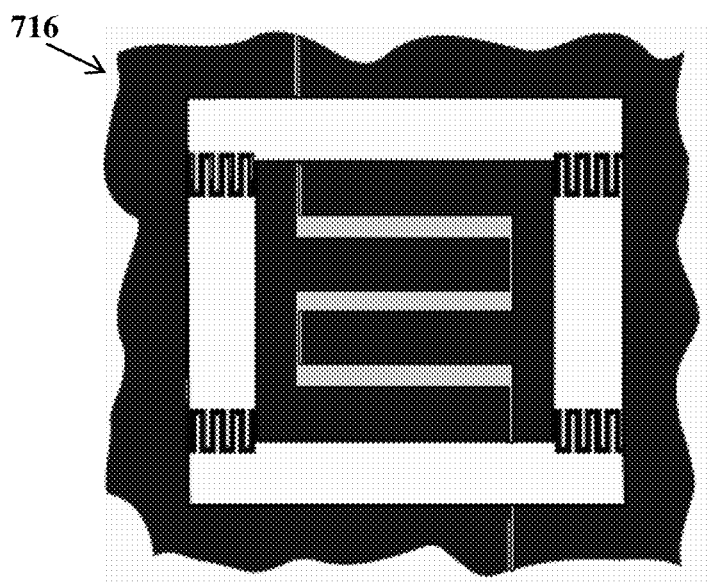

FIG. 7B illustrates a resonator 204 and denotes the possibility to adjust the number, position and dimension of the suspension anchors between the resonating structure plate and the peripheral region.

FIG. 7C to FIG. 7H, illustrating resonators 706, 708, 710, 712, 714, and 716, respectively, provide non-limiting examples for adjusting the anchor shape with the self-aligned electrode design.

It should be appreciated that the different anchor designs may satisfy different design goals or requirements in terms of resonator quality factor, stress-release functionality, thermal behavior, heating functionality and unwanted spurious resonances, among other possibilities.

It should be further appreciated that multiple designs of the mechanical resonating structure with substantially different primary resonator properties can be obtained from only a single "universal" conductor configuration mask.

Figure 8:
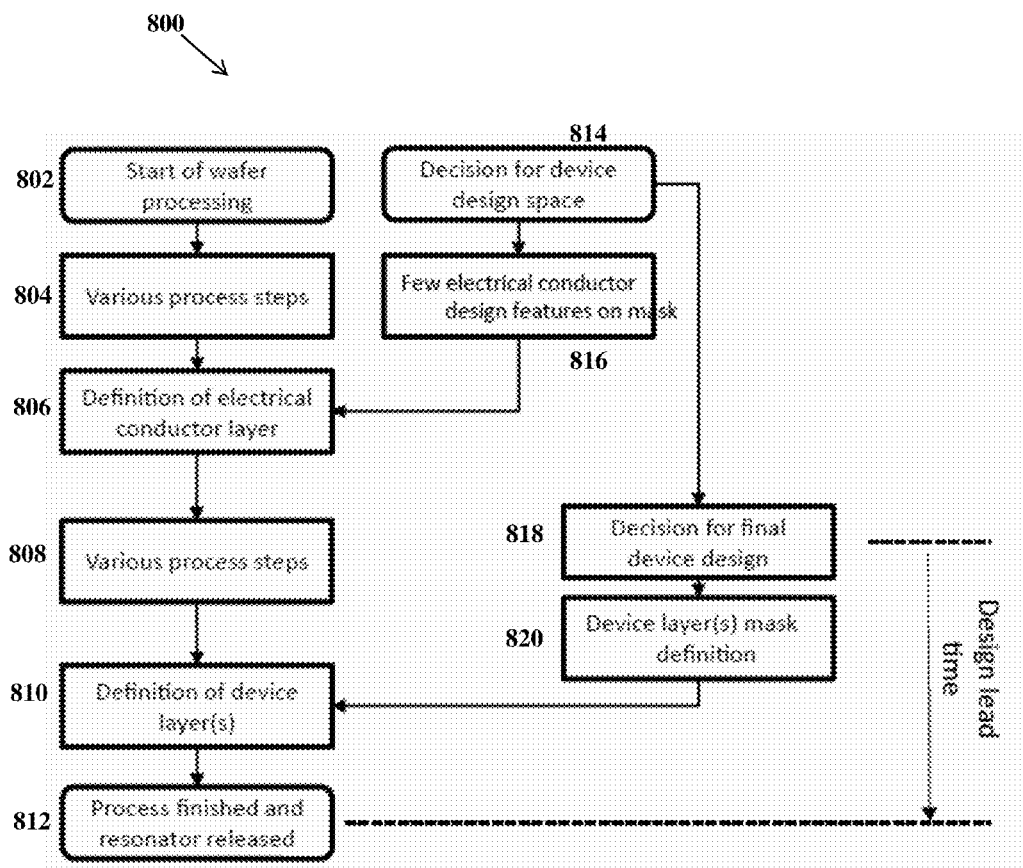
FIG. 8 illustrates an example of a process for forming a self-aligned electrode resonator design, according to a non-limiting embodiment.

As described previously, aspects of the present application provide for reduced lead time in design and manufacture of mechanical resonating structures or other devices having electrodes. FIG. 8 illustrates an example of a process and design flow 800 associated with the self-aligned electrode designs illustrated in FIGS. 5A and 6A. After starting the processing of the wafer at stage 802, there may be various process steps (e.g., depositions, surface preparations, polishing, planarizing, etc.) performed before the electrical conductor layer is defined photolithographically. Such process steps are illustrated for purposes of simplicity as a single stage 804. Prior to stage 804, the decision of the larger device design space in terms of mask for the electrical conductor patterning may be performed at stage 814, and may be limited to determining/defining the electrical conductor width, periodicity, and the metallization ratio for the inner electrodes. Such features may be determined and finalized for a mask at stage 816. The anchor shape, dimensions, position and number, and the plate dimensions may be defined later, for example in the definition of the device layer(s), or at any other suitable stage.

At stage 806, the conductor layer may be defined using the mask resulting from stage 816. Subsequently, at stage 808, various processing steps may be applied, such as passivation, deposition, etching, planarization, or other processes. Such processes are illustrated as a single stage (i.e., stage 808) for purposes of simplicity.

At stage 810, the device layer(s) may be defined. Prior to such definition, the final design for the device layer(s) may be made at stage 818 and an appropriate mask or masks may be finalized at stage 820. Then, at stage 810, the device layer(s) may be defined using the mask(s) resulting from stage 820.

At stage 812, the process for manufacturing the resonator may be finished and the resonator released.

It should be appreciated that the design lead-time for the self-aligned electrode design illustrated in FIG. 8 is reduced by a large amount (e.g., compared to the lead time shown in FIG. 4) and typically much shorter than the overall wafer processing time. Moreover, defining the electrical conductor together with the plate dimensions of the mechanical resonating structure reduces the cost for design alterations as only a single mask change is necessary in some embodiments.

Aspects of the present application also provide for improved etching of mechanical resonating structures or other microfabricated devices. In some cases, the final device release (e.g., release of a mechanical resonating structure) may be an etching with a very large aspect ratio as the lateral dimension of the trenches 105 may be small compared to the thickness T of the resonating structure plate. As photo-resist deposition, exposure and etching are non-uniform processes even within one wafer, it may be necessary in some embodiments (but not all) to have a certain minimum thickness to allow the edging of the plurality of dies on one wafer. In contrast, thicker photoresist worsens the achievable lithographic resolution.

For example, the usage of a very thin layer of photo-resist may allow a good photolithographic resolution for the majority of devices, but simultaneously corrupt the etching of some devices on the wafer as resist is substantially corroded during the etch process.

Figure 9A:
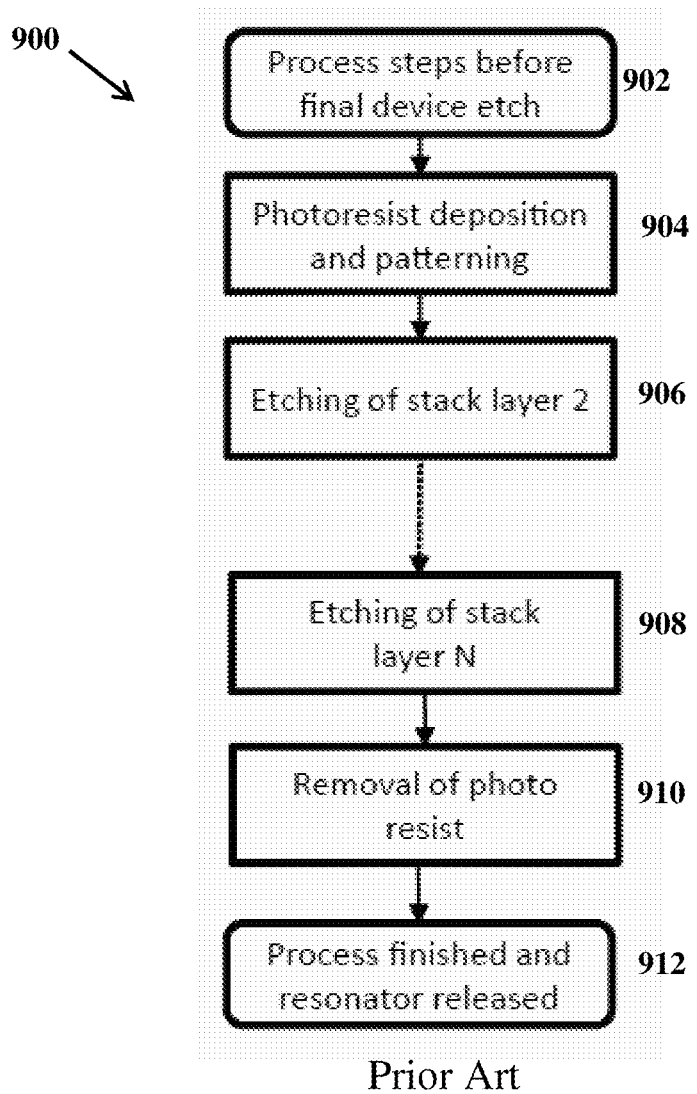
FIG. 9A illustrates a conventional process flow for forming resonator electrodes.

FIG. 9A depicts a device release etch process flow 900 for a conventional electrode configuration. Various process steps may be applied prior to the final device etch, and are represented as a single stage 902. Photoresist is deposited and patterned at stage 904 and all device layers are etched (stack layer(s) 2 to N) as represented by stages 906 and 908. At stage 910 the photoresist may be removed. At stage 912, the fabrication process is finished and the resonator is released.

Figure 9B:
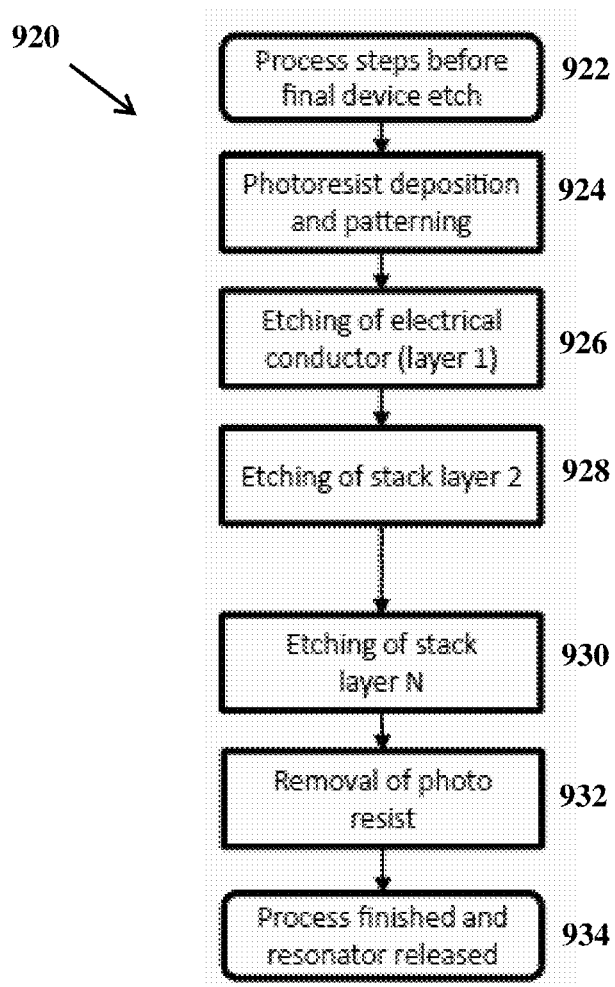
FIG. 9B illustrates a process flow for forming a self-aligned resonator electrode, according to a non-limiting embodiment.

FIG. 9B depicts an example of a process flow 920 for using the self-aligned electrode. Various process steps may be applied prior to the final device etch, and are represented as a single stage 922. The photoresist is deposited and patterned at stage 924 and in the following stage 926 the electrical conductor is etched. The device layers 1, 2, . . . N are then etched in stages 926, 928, . . . 930. In some embodiments, the etching process of all the device layer(s) is selected to have a high etch selectivity between the device layer(s) and the electrical conductor layer, so that the electrical conductor layer acts as an additional hard mask during all etching steps. It should be appreciated that this can improve the etch quality and uniformity substantially. The photo resist is then removed at stage 932 and the process is finished and the resonator released at stage 934.

Figure 9C:
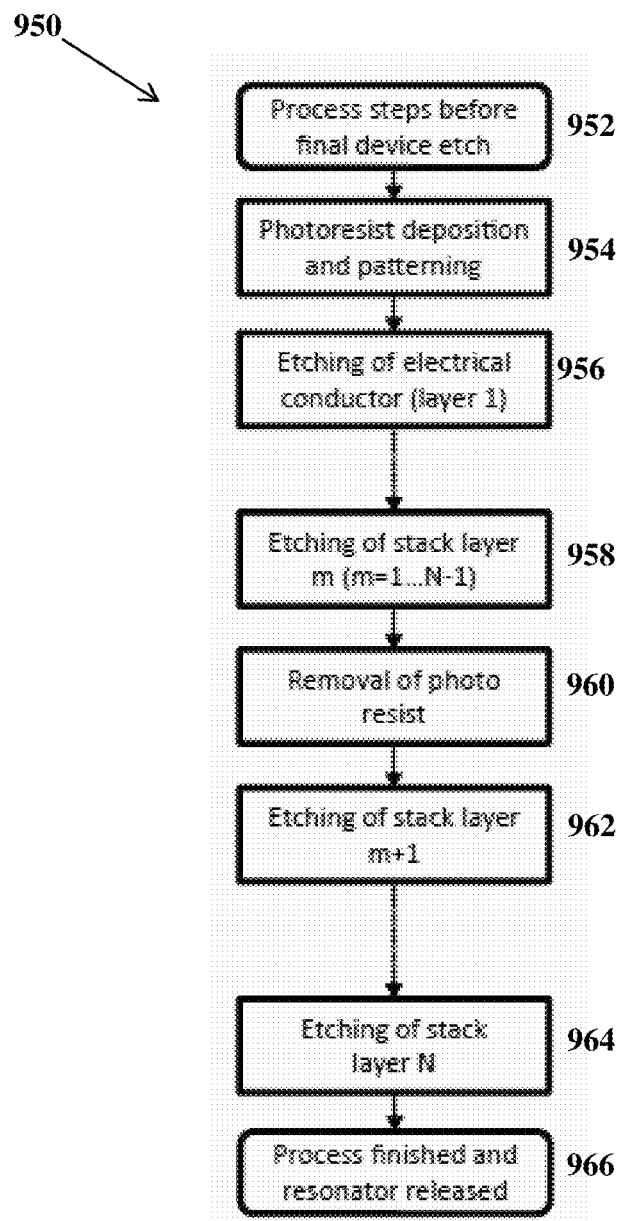
FIG. 9C illustrates a process flow for forming a resonator, according to a non-limiting embodiment.

FIG. 9C depicts an example of an alternative process flow 950 enabled by the usage of the self-aligned electrode. Various process steps may be applied prior to the final device etch, and are represented as a single stage 952. The photoresist is deposited and patterned at stage 954 and in the following stage 956 the electrical conductor is etched. The device layer (s) of the resonator stack may then be etched at stage 958

(etching of layer m, where m=1 . . . N−1). The photoresist may then be removed at stage 960. At stage 962, device layer m+1 of the resonator stack may be etched and at stage 964 layer N of the resonator stack may be etched. At stage 966, the fabrication process may be finished and the resonator released.

As in the process flow of FIG. 9B, in the process 950 of FIG. 9C the electrical conductor layer acts as an hard mask. However the photoresist is removed after the etching of stack layer m. It should be appreciated that this not only can improve the etch quality and uniformity substantially, but also the lithographic resolution as the photoresist thickness needs only to be sufficient for etching of some layers and not all layers.

Figure 10A:
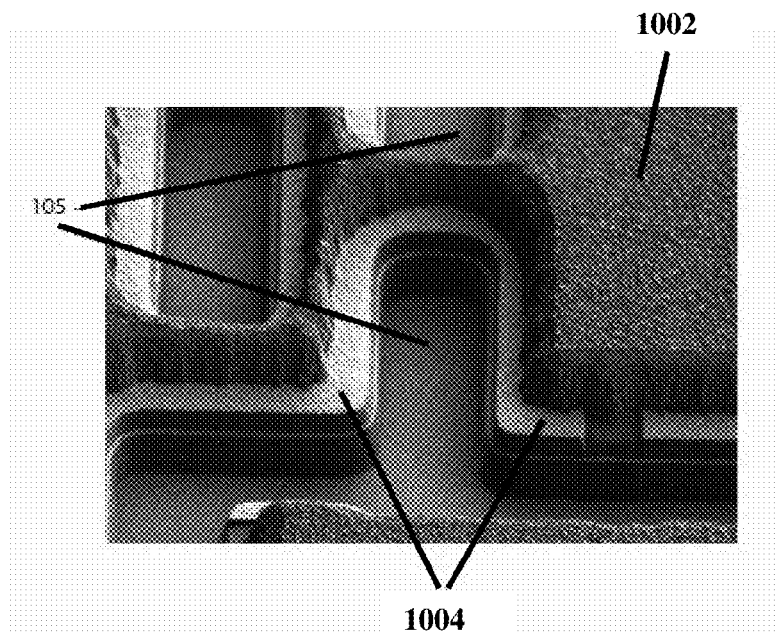
FIG. 10A illustrates an example of recessed photoresist edges relative to underlying resonator layers.

FIG. 10A is a scanning electron micrograph (SEM) of a portion of a microfabricated device. As shown, the photoresist 1002 is recessed to the resist recess 1004 during the etching of trenches 105 if the resist thickness is thin. The resist recess 1004 is already significant in the illustrated figure, although the trenches 105 are not yet completely etched through all device layer(s). Where the resist is recessed, it cannot protect the underlying electrical conductor layer anymore, which as a consequence then is corroded in the following device layer etch steps.

Figure 10B:
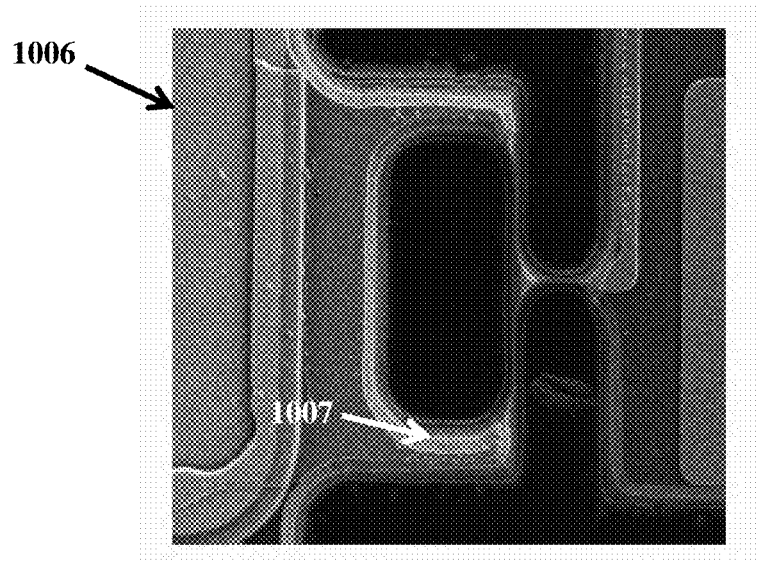
FIG. 10B is a picture of a resonator anchor structure resulting from etching using a recessed photoresist layer.

FIG. 10B shows an SEM picture of a top view of a device anchor structure 1006 after the etch process with a thin resist layer for a non-self-aligned electrode design. It can be seen that the anchor features are significantly overetched as shown at 1007, and from the top view it is observable that the side wall has a sloped profile. Overetch and sloping are not controllable within one wafer and from wafer-to-wafer, leading to a large variation in device performance and small gross yield.

Figure 10C:
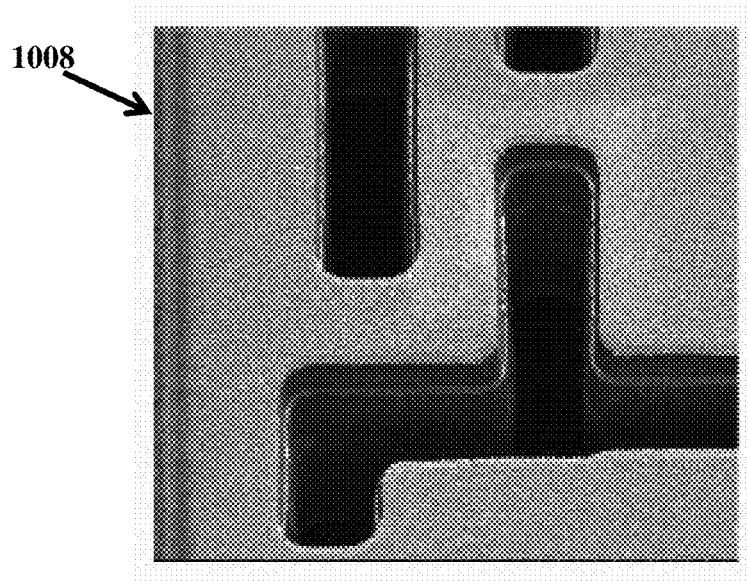
FIG. 10C is a picture of a resonator anchor structure formed using a self-aligned anchor design, according to a non-limiting embodiment.

FIG. 10C shows an SEM picture of a top view of a device anchor structure 1008 after the etch process with a thin resist layer for the self-aligned electrode design. It can be seen that the anchor features are not overetched, and it should be appreciated that the side wall has a straight side-wall profile, to be contrasted with the structure of FIG. 10B. This results from the fact that the device-etch was chosen to have a high selectivity to lower device layers, wherefore the top-most layer acts as an hard-mask as described above. Device performance variation in-wafer and wafer-to-wafer may be tightly controlled.

One or more benefits may be realized from implementation of one or more aspects of the present application. For example, flexibility in electrode design may be provided. As explained previously, final definition of an electrode may be saved until the latter stages of formation of a device (e.g., a MEMS resonator). Thus, various features of the device may be formed prior to final definition of the electrode(s), the device may be tested in one or more manners, and then the final electrode definition may be made. Thus, flexibility may be provided by reserving final definition of the electrodes until a late stage of processing.

Another benefit which may be realized includes improved etching of resonator layers below the electrodes. As described, a blanket conductive film may be deposited, which may serve as an etch match for etching of lower layers (e.g., active layers, etc.), which may in turn facilitate accurate fabrication of resonators or other devices.

A further benefit which may be realized includes improved symmetry. For example the conventional electrode design defining the routing on the plate may be intrinsically asymmetric for acoustic wave modes and may become even more asymmetrical for a misalignment between the electrical conductor mask 302 and the device mask 304. The self-aligned electrode looks substantially symmetrical and may be easily adjusted to maximum symmetry for acoustic wave modes. Therefore conversion between modes of different symmetry cannot occur easily. This reduces the number of modes coupling to the electrical field and the main mode, wherefore ripples in the electrical response around the frequency of resonance are reduced and the main mode may encounter fewer frequency jumps with varying temperature.

Another benefit which may be realized is a shorter design time. As previously described, by leaving the final definition of an electrode until the latter stages of processing, multiple resonators with a "generic" electrode design may be fabricated in parallel. From those resonators, a subset may have their electrodes fully defined and may be tested. If the testing indicates that an alternative electrode design would be preferable, the remaining wafers may be formed with the alternative electrode design from the generic design, without having to fabricate the entire resonator structure again. Thus, significant gains in development time may be realized.

It should be appreciated that the foregoing examples of benefits are non-limiting, and that other benefits may alternatively or additionally be realized. Moreover, not all embodiments necessarily provide each benefit.

It should be appreciated that various aspects of the technology may apply to various types of mechanical resonating structures. Therefore, the various aspects described herein are not limited to use with any particular type of mechanical resonating structures. Rather, the mechanical resonating structure may comprise or be formed of various materials, may be a single or multi-layered structure, may take various shapes, including straight-edged shapes and shapes with beveled edges (described further below), may have any suitable absolute dimensions, may have any operational frequency range and desired resonance frequency, and may be actuated and/or detected in any suitable manner.

Unless the context clearly requires otherwise, throughout the disclosure, the words "comprise," "comprising," and the like are to be construed in an inclusive sense as opposed to an exclusive or exhaustive sense; that is to say, in a sense of "including, but not limited to." Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list; all of the items in the list; and any combination of the items in the list.

Having thus described several embodiments of this disclosure, it is to be appreciated that various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

All patent applications and patents incorporated herein by reference are incorporated by reference in their entirety. In case of conflict, the present specification, including definitions, will control.

What is claimed is:

1. A mechanical resonating structure, comprising:
   an active layer; and
   a self-aligned electrode layer,
   wherein the self-aligned electrode layer has a periphery substantially matching a periphery of the active layer.

2. The mechanical resonating structure of claim 1, wherein the active layer comprises aluminum nitride (AlN).

3. The mechanical resonating structure of claim 1, wherein the self-aligned electrode layer is patterned to define a spacing between electrodes.

4. The mechanical resonating structure of claim 3, wherein the self-aligned electrode layer is patterned to define a spacing and period between electrodes.

5. The mechanical resonating structure of claim 1, wherein the self-aligned electrode layer is configured as an etch mask for the active layer.

6. The mechanical resonating structure of claim 1, wherein the self-aligned electrode layer forms an interdigital transducer (IDT) electrode.

7. A mechanical resonating structure, comprising:
an active layer;
a self-aligned electrode layer; and
self-aligned electrical connections between the self-aligned electrode layer and an electrical port on a substrate to which the mechanical resonating structure is connected.

8. The mechanical resonating structure of claim 7, wherein the self-aligned electrode layer forms an interdigital transducer (IDT) electrode.

9. A mechanical resonating structure, comprising:
an active layer; and
a self-aligned electrode layer,
wherein a periphery of the self-aligned electrode layer is substantially coincident with a periphery of all layers below the active layer.

10. The mechanical resonating structure of claim 9, wherein the mechanical resonating structure further comprises a temperature compensation stack below the active layer, the temperature compensation stack comprising first and second layers.

11. The mechanical resonating structure of claim 9, wherein the self-aligned electrode layer forms an interdigital transducer (IDT) electrode.

* * * * *